United States Patent
DiStefano et al.

(10) Patent No.: US 6,202,299 B1
(45) Date of Patent: *Mar. 20, 2001

(54) SEMICONDUCTOR CHIP CONNECTION COMPONENTS WITH ADHESIVES AND METHODS OF MAKING SAME

(75) Inventors: Thomas H. DiStefano, Los Gatos, CA (US); Gus Karavakis, Coram, NY (US); Zlata Kovac, Los Gatos; Craig Mitchell, San Jose, both of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,216

(22) Filed: Dec. 11, 1998

Related U.S. Application Data (62) Division of application No. 08/658,577, filed on Jun. 5, 1996, now Pat. No. 5,875,545, which is a division of application No. 08/143,080, filed on Oct. 26, 1993, now Pat. No. 5,548,091.

(51) Int. Cl.$^7$ ................................................ H05K 3/34
(52) U.S. Cl. ............................... 29/840; 29/825; 29/827; 29/843; 228/33; 228/56.3; 228/123.1; 228/179.1; 228/180.1
(58) Field of Search .............................. 29/840, 827, 839, 29/843, 860, 832, 825; 228/180.21, 179.1, 180.1, 33, 56.3, 123.1, 248.1; 437/209, 211, 215, 217; 357/70, 74, 80

(56) References Cited

U.S. PATENT DOCUMENTS

| | | |
|---|---|---|
| 2,264,632 | 12/1941 | Gerlitzki . |
| 3,868,724 * | 2/1975 | Perrino ................................. 357/65 X |
| 4,157,932 | 6/1979 | Hirata . |
| 4,188,438 * | 2/1980 | Burns ................................. 428/209 X |
| 4,237,607 * | 12/1980 | Ohno ................................. 29/840 X |
| 4,308,339 * | 12/1981 | Lindberg ........................... 430/312 X |
| 4,419,818 | 12/1983 | Grabbe . |
| 4,515,297 | 5/1985 | Schoenthaler et al. . |
| 4,803,124 | 2/1989 | Kunz . |
| 4,955,132 | 9/1990 | Ozawa . |
| 5,008,997 | 4/1991 | Phy . |
| 5,072,289 | 12/1991 | Sugimoto et al. . |
| 5,148,265 | 9/1992 | Khandros et al. . |
| 5,148,266 | 9/1992 | Khandros et al. . |
| 5,157,828 | 10/1992 | Coques et al. . |
| 5,170,329 | 12/1992 | Purdes . |
| 5,232,532 | 8/1993 | Hori . |
| 5,258,330 | 11/1993 | Khandros et al. . |
| 5,406,459 | 4/1995 | Tsukamoto et al. . |
| 5,579,573 | 12/1996 | Baker et al. . |

FOREIGN PATENT DOCUMENTS

| | | |
|---|---|---|
| 1133701 | 1/1985 | (SU) . |
| WO 92/05582 | 2/1992 | (WO) . |
| WO 94/03036 | 3/1994 | (WO) . |

* cited by examiner

*Primary Examiner*—Michael O'Neill
*Assistant Examiner*—Binh-An D. Nguyen
(74) *Attorney, Agent, or Firm*—Lerner, David, Littenberg, Krumholz & Mentlik, LLP (57) ABSTRACT

A semiconductor chip connection component is provided with an adhesive, desirably in a solid, non-tacky condition on its bottom surface. The adhesive may be present in a pattern covering less than all of the component bottom surface, so as to provide a void-free interface when the adhesive bonds the component to the top surface of a chip. The adhesive desirably is brought to a flowable condition by heat transferred from the chip itself. The connection component may include leads having base metal strips in a trace area underlying the top surface and noble metal portions protruding beyond an edge of the top layer. A flowable, curable material encapsulates the base metal sections. Because the base metal sections desirably are free of undercuts, the same can be encapsulated in a void-free manner during formation of the component.

4 Claims, 6 Drawing Sheets

SEMICONDUCTOR CHIP CONNECTION COMPONENTS WITH ADHESIVES AND METHODS OF MAKING SAME

This application is a divisional application of application Ser. No. 08/658,577 filed Jun. 5, 1996, now U.S. Pat. No. 5,875,545 which is a divisional application of application Ser. No. 08/143,080, filed on Oct. 26, 1993 which issued into U.S. Pat. No. 5,548,091 on Aug. 20, 1996.

FIELD OF THE INVENTION

The present invention relates to the art of electronic packaging and more specifically relates to components useful in assembly of semiconductor chips to substrates, to methods of mounting and connecting chips using such components and to methods of making such components.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to interconnect a single chip to external circuits. In a so-called "hybrid circuit" or "module", one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate.

The structures utilized to provide the connection between the chip and the substrate must accommodate all of the required external electrical interconnections to the chip. Advanced chips may require hundreds of I/O connections. Structures connecting a chip to a substrate ordinarily are subject to substantial strains caused by thermal cycling as temperatures within the device change during operation. The chip and substrate ordinarily expand and contract by different amounts. This causes the electrical contacts on the chip to move relative to the electrical contact pads on the substrate, thus deforming the electrical interconnections between the chip and substrate and places them under mechanical stress. These repeated stresses can cause breakage of the electrical interconnections. The cost and size of the chip and substrate assembly are also major concerns. Moreover, there should be a convenient way to test the chip and the interconnections before assembling it to the substrate, and a convenient way to salvage chips if the interconnections are faulty. All these concerns, taken together, have presented a formidable engineering challenge.

It has recently been proposed to solve these problems by providing a sheet-like, preferably flexible interposer top layer with electrical terminals thereon. This flexible layer is mounted over the face of the a chip, desirably with a soft, compliant material disposed beneath the terminals and, typically, beneath the top layer. The terminals are electrically connected to contact pads on the chip, as by flexible leads. The terminals can be engaged with or bonded to contact pads on a substrate so as to connect the chip to the substrate. Because the terminals are moveable with respect to the contacts on the chip in directions parallel to the face of the chip, the assembly compensates for thermal expansion. Also, because the terminals are compliant or moveable in the vertical directions normal to the face of the chip, the terminals can be readily engaged with a test probe subassembly before assembly to the substrate. Thus, the subassembly can be tested prior to assembly to the substrate. As disclosed, for example in commonly assigned U.S. Pat. No. 5,148,265 and in International Publication WO 92/05582, performed connection component may include a flexible top layer and may also include a compliant bottom layer. Such component is then assembled atop the chip surface and connected as described above. The same publications also mention the possibility of providing a compliant layer formed separately from the top layer and having adhesives thereon so that the compliant layer may be prepositioned on the chip surface before the top layer is applied thereon. As also disclosed in these publications, it is possible to form the compliant layer from a partially cured elastomer which is fully cured after assembly of the top layer, so that the compliant layer itself adheres to the chip and to the top layer to bond the same together.

As further disclosed in co-pending, commonly assigned U.S. patent application Ser. No. 07/919,772, of Jul. 24, 1992, and in co-pending commonly assigned International Patent Application PCT US 93/069,930, the disclosures of which are hereby incorporated by reference herein, a connection component may include a support structure and leads extending across gaps in the support structure. The support structure may include, for example, a sheetlike flexible top layer as discussed above as well as a compliant bottom layer. The entire structure is positioned on the chip, with the leads substantially aligned to the contact pads of the chip. A part of each lead extending across the chip is then engaged by a bonding tool and forced downwardly into engagement with the contact pad. Typically, one end of each lead is detached from the support structure during this process.

In these processes, it is desirable to exclude air from between the various layers of the connection component and the support structure. The chip and substrate normally are encapsulated by potting or similar processes in which a flowable encapsulant encases the assembly and then hardens to form a permanent structure. Trapped air can expand during temperature changes in the encapsulation process or in subsequent operation of the device, and can damage the assembly. Moreover, trapped air can cause a breach in the seal provided by the encapsulant.

One approach which eliminates any possibility of trapped air between the layers of the support structure and between the support structure and the chip is to form the bottom or compliant layer of the support structure in situ from a liquid material introduced between the top layer of the support structure and the chip. Such an approach is disclosed, for example, in the preferred embodiments of commonly assigned, co-pending U.S. patent application Ser. No. 08/123,882, filed Sep. 20, 1993. The flexible top layer and leads may be positioned above the chip and, before or after bonding the leads to the chip, the liquid material may be introduced between the top layer and chip. The liquid material subsequently is cured to form a compliant layer beneath the top layer. This approach substantially eliminates the possibility of air entrapment. Because a liquid material must be handled and placed into each assembly, this approach imposes some constraints on the production process. Further improvement therefore would be desirable.

In semiconductor connection components and processes as discussed above, air can also be trapped in the vicinity of the leads, particularly where the leads extend on the underside of the top layer, between the top layer and the compliant layer. This may occur occasionally even where the compliant layer is formed from air curable liquid material cured in contact with the top layer. Accordingly, still further improvements directed towards elimination of such air entrapment would be desirable.

SUMMARY OF THE INVENTION

The present invention is directed to the desired improvements discussed above.

One aspect of the present invention provides a prefabricated connection component for a semiconductor chip. The connection component includes a flexible sheet-like support structure having top and bottom surfaces and further includes electrical terminals and leads on the support structure. Each terminal is connected to a lead and each lead is disposed on the support structure so that the leads can be engaged with contacts on a semiconductor chip when the bottom surface of the support structure is disposed on the chip. The connection component further includes an adhesive disposed on the bottom surface of the support structure, the adhesive being adapted to bond the bottom surface of the support structure to the chip. Most preferably, the support structure includes a flexible top layer forming the top surface as well as a compliant layer beneath the top layer. Typically, the compliant layer defines the bottom surface of the support structure. The adhesive desirably is solid and non-tacky at temperatures below a preset activation temperature, but is adapted to reach a flowable condition upon heating to above the preset activation temperature, and to form a bond after such heating. As further explained below, the non-tacky nature of the adhesive is particularly useful in eliminating air entrapment during the bonding process. The preset activation temperature typically is above room temperature, so that the connection component can be handled readily without refrigeration or other special measures.

Most preferably, the adhesive is disposed in a non-uniform pattern on the bottom surface, the pattern including a plurality of adhesive masses on the bottom surface and the depressions between the adhesive masses. The bottom surface typically has edges and a center remote from the edges. The adhesive masses desirably include a plurality of elongated masses extending outwardly from adjacent to the center of the bottom surface, towards the edges thereof. Thus, the elongated masses may form a substantially radial, star-like pattern. The adhesive masses may further include a central mass of adhesive disposed adjacent to the center of the bottom surface, the radially extensive masses being connected to this central mass. During the bonding process, the adhesive flows in such a manner as to substantially eliminate air between the bottom surface of the support structure and the top surface of the chip. The adhesive fills the small irregularities or "topography" on the chip top surface. As further discussed below, the initially solid, heat-activatable nature of the adhesive contributes to the air—eliminating action. The patterning of the adhesive further contributes to this action.

Preferably, the adhesive is adapted to form a relatively weak bond to the bottom surface of the support structure or to the surface of the chip. Thus the support structure can be removed from a chip after bonding thereto. This greatly facilitates repair and reclaim of chips from subassemblies which prove to be defective when tested. Such defective subassemblies may arise, for example, where there is a fault in the connection component or the bonding process. Where the support structure includes a bottom layer, such as the compliant layer, defining the bottom surface and an adjacent layer, typically the top layer, immediately overlying the bottom layer, the bottom layer is bonded to the adjacent layer so that this bond has a first peel strength. The adhesive is adapted to bond to the bottom surface of the support structure, or to the chip with a peel strength less than this first peel strength.

Further aspects of the present invention provide methods of mounting connection components on semiconductor chips. A method according to this aspect of the present invention preferably includes the steps of providing a preformed connection component having a flexible sheet-like support structure with a bottom surface and with an adhesive on such bottom surface, the connection component also having electrical terminals and leads thereon. The method further includes the step of aligning the connection component with the chip so that the leads on the connection component are aligned with contacts on the chip and bonding the bottom surface of the support structure to a surface of the chip by engaging the bottom surface of the support structure against the chip surface and activating the adhesive on the support structure bottom surface while maintaining the alignment between the conductors of the connection component and the contacts on the chip. Most preferably, the bonding step includes the step of moving the connection component relative to the chip in an engagement direction substantially normal to the surface of the chip after the aligning step so as to engage the bottom surface of the connection component with the surface of the chip. Such normal motion can be readily combined with an alignment process using automatic pattern recognition with other automated alignment steps without disturbing the alignment achieved by these steps.

The bonding step desirably includes the step of momentarily heating the adhesive while the adhesive is engaged between the bottom surface of the connection component and the surface of the chip. In a particularly preferred arrangement, the chip may be at an elevated temperature prior to the bonding step, so that the adhesive is heated by heat transferred from the chip to the adhesive when the adhesive is engaged with the chip surface. The adhesive desirably is solid and non-tacky prior to engagement with the hot chip. Further, the adhesive on the connection component desirably is in the form of a plurality of adhesive masses with depressions therebetween, and most desirably in a radial or star-like pattern as discussed above. Although the present invention is not limited by any theory of operation, it is believed that this permits air to escape from between the adhesive masses and the chip surface through the depressions as the adhesive is engaged with the chip surface.

In methods according to this aspect of the invention, the bottom surface of the support structure, typically the bottom surface of the compliant layer, bonds to the chip substantially without air entrapment therebetween. Following the bonding operation, the leads on the connection component are connected to the aligned contacts of the chip to thereby connect the contacts of the chip to the terminals of the connection component. Following this procedure, the chip and connection component subassembly may be tested, assembled to a substrate and encapsulated.

According to a further aspect of the invention, a connection component for a semiconductor chip may include a sheet-like support structure including a flexible top layer and a second layer, typically a compliant layer, underlying the top layer, the support structure having at least one edge. The connection component may further include a plurality of terminals on the support structure remote from the edge and a plurality of leads connected to the terminals, each such lead including a substantially flat, solid, strip-like portion formed from a base metal extending between the layers of the support structure from the terminal to the edge, and may also include a connection portion incorporating a noble metal extending beyond the edge. The layers of the support structure form a substantially void-free interface around the base metal portions of the leads.

According to a related aspect of the present invention, a method of fabricating a connection component for a semiconductor chip may include the step of providing a dielectric, typically flexible top layer with a thin, flat layer of a base metal so that a lamination zone of the base metal layer underlies the bottom surface of the top layer in intimate contact therewith, and so that the base metal layer also has a connection zone extending from the lamination zone. A noble metal is provided on the base metal layer only in the connection zone portion. The method preferably includes the step of etching the base metal portion to form elongated, strip-like leads extending from the lamination zone to the connection zone. Thus, each lead will include a connection zone portion including the noble metal and a trace or lamination zone portion formed from the base metal, without the noble metal. If the base metal layer is a thin layer, the method may further include the step of applying relatively thick strips of a base metal over the thin layer in the lamination zone. Each trace thus will include both the applied strip and the underlying strip of the base metal layer. The steps of etching the base metal portion and of providing a noble metal on the base metal may be conducted as parts of a multi-step plating and etching process, so that the noble metal may be applied to the base metal before or after the base metal is etched to form the strips. Also, the noble metal connection zone portions of the leads may be exposed by removing a part of the top layer overlying the connection zone.

After the base metal has been etched to form the leads, a second support structure layer is applied on the bottom surface of the top layer in the area originally occupied by the connection zone of the base metal layer. Thus, the traces are sandwiched between the second support structure layer and the top layer. The step of applying the second support structure layer most preferably includes the step of applying a flowable material such as a liquid to the bottom surface of the top layer and to the base metal traces and curing the flowable material to form the second support structure layer or to form a bond between the second support structure layer and the top layer. These aspects of the present invention incorporate the realization that, although noble metals are highly desirable in the connection sections of the leads, they can create undesirable artifacts when present in the traces crossing the lamination zone. In the connection sections, the noble metals provide good metallurgical properties for bonding to the contact of the semiconductor chip. However, if used in the lamination zone, the noble metal may create a rail-like, undercut shape when etched. That shape, in turn, can cause entrapment of air when the second support structure layer is applied. In the preferred methods and structures according to this aspect of the invention, the noble metal is applied only in the area where it is needed, and the undesirable artifacts caused by noble metal in the lamination zone are avoided.

DETAILED DESCRIPTION OF THE PREFERRED EMBODIMENTS

Figure 3:
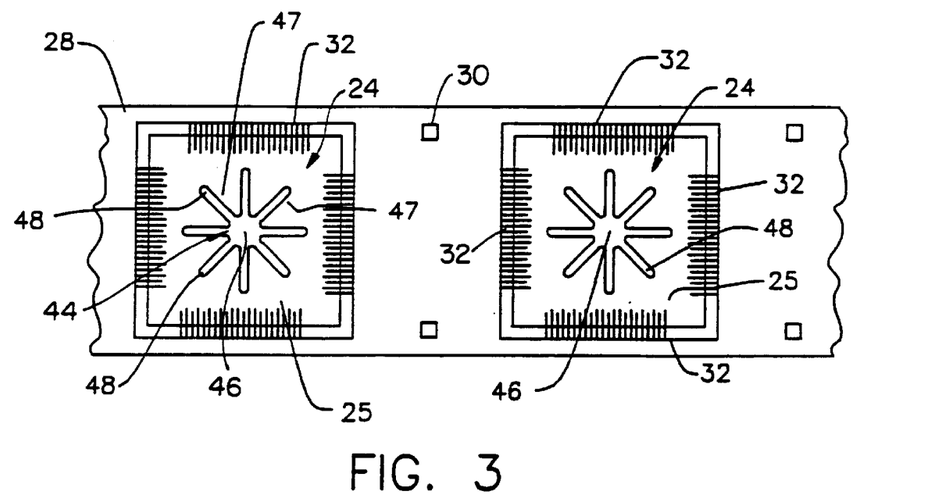
FIG. 3 is a diagrammatic bottom plan view of the tape illustrated in FIGS. 1 and 2.

Prefabricated connection components in accordance with one embodiment of the invention incorporate a support structure 20 comprising a thin, flexible top layer 22, preferably formed from a dielectric material such as a polyimide and a compliant bottom layer 24 (FIGS. 3 and 4) formed from a low elastic modulus material such as a silicone elastomer material. Bottom layer 24 defines the bottom surface 25 of the support structure. The bottom, compliant layer 24 of each support structure 20 is bonded to the top, flexible layer 22 of such support structure by a substantially non-releasable bond 23. Bond 23 may be formed by an adhesive distinct from the material of either layer applied and cured between the layers in any suitable manner. However, the adhesive bonding process used for this stage of manufacture should be controlled so that air is not trapped between the two layers. In this particular arrangement, where the bottom surface of layer 22 and the top surface of layer 24 are both substantially flat, and devoid of any electrical conductors or other protrusions, such an air free bond can be formed by any conventional laminating process. Where the top layer 22 is a polyimide and the bottom layer 24 is a silicone elastomer, the adhesives which can be used to form bond 23 include uncured or partially cured silicone elastomers. One such silicone elastomer useful in bottom layer 24 and in bond layer 23, is sold under the trademark Sylgard 577 by the Dow Corning Corporation of Midland, Mich. For example, an uncured or partially cured "B staged" silicone elastomer may be applied between the cured silicone elastomer layer 24 and the polyimide layer 22 and cured after these two layers have been brought into engagement with one another to thereby form bond 23. Alternatively, bond 23 may be formed by casting or curing layer 24 in place on the bottom surface of layer 22. For example, layer 22 may be applied as a liquid silicone resin and cured in place, or else may be applied as a partially cured "B staged" material and cured in place.

Figure 1:
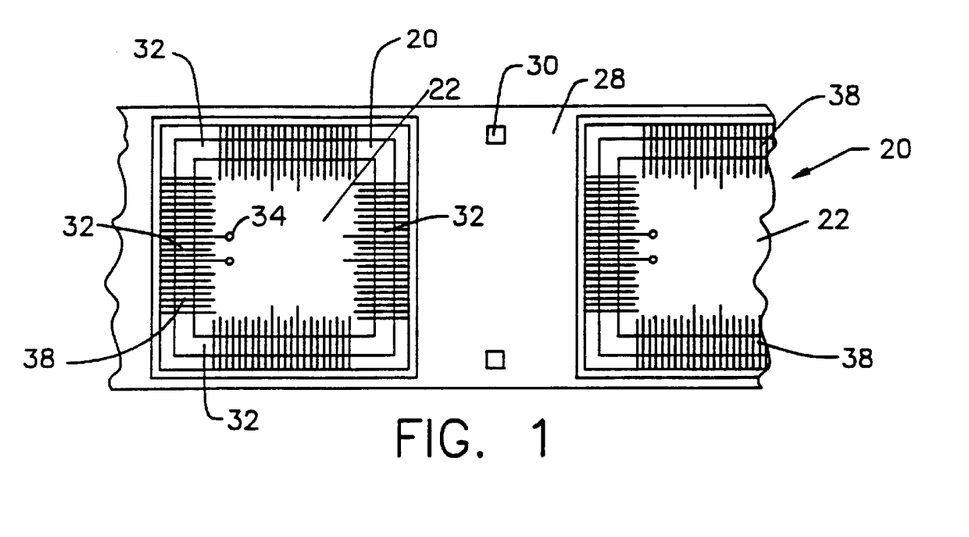
FIG. 1 is a diagrammatic top plan view of a tape including a plurality of connection components of one embodiment of the present invention.

Top layer 22 and bottom layer 24 are generally rectangular and substantially coextensive with one another. Top layer 22 is formed integrally with a support or carrier tape 28 formed from the same polyimide material. Carrier tape 22, in turn, is formed integrally with additional top layers 22 of other support structures 20 of additional connection components. Tape 28 is further provided with handling and locating features, schematically indicated as sprocket holes 30. Each top layer 22 is separated from the surrounding portions of tape 28 by a series of continuous gaps 32 cooperatively extending entirely around the top layer and hence entirely around connection component support structure 20.

Figure 2:
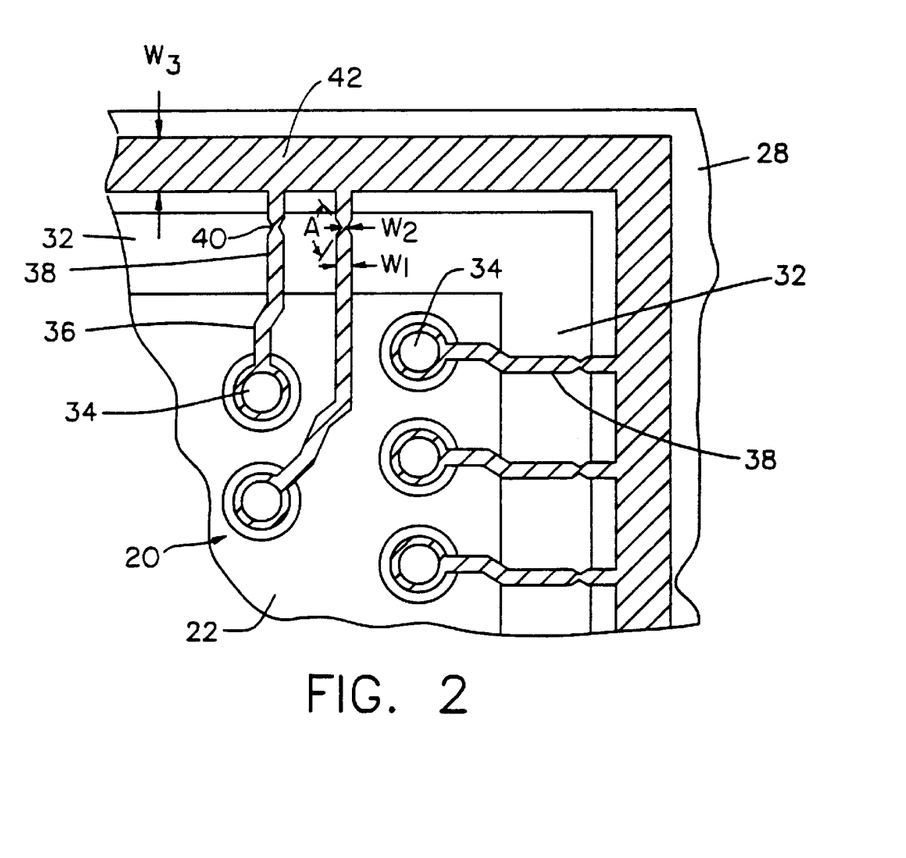
FIG. 2 is a detailed on an enlarged scale, depicting an area of the tape shown in FIG. 1.

Each connection component is provided with a set of electrical terminals 34 mounted on the top surface of support structure top layer 22. Terminals 34 are arranged in a pattern suitable for bonding to a substrate. Terminals 34 may be disposed at substantially even spacings covering a substantial portion of the top surface, i.e., in a so-called "area array". However, any other suitable pattern may be used as well. The terminals typically incorporate metallic materials such as nickel, gold, and the like. Each terminal is connected to an elongated metallic electrical lead 36 extending from the terminal on top surface 22. Each lead 36 has a connection section 38 extending across one of the gaps of 32. A distal end of each connection section 38, remote from support section 20 and top layer 22 is connected via a frangible section 40 to a bus structure 42 anchored on tape 28 and surrounding the gaps 32. The structure of the terminals, leads, frangible sections and bus structure in this embodiment may be in accordance with co-pending, commonly assigned International Application US 93/06930. Typically, the leads extending across each gap 32 are disposed substantially parallel to one another in a side by side arrangement.

Each connection component further includes an adhesive 44 (FIGS. 3 and 4) disposed on the bottom surface of compliant or bottom layer 24 in a pattern incorporating a plurality of adhesive masses. The adhesive masses include a central mass 46 disposed adjacent the center of the bottom surface and a plurality of elongated masses 48 extending radially outwardly from central mass 46 in a generally star-like pattern. Thus, each elongated mass 48 protrudes from adjacent the center of the bottom layer bottom surface towards the periphery, i.e., towards the outer edges of the bottom surface. The regions of bottom surface 25 between the adhesive masses are substantially devoid of the adhesive. These regions thus constitute depressions or grooves 47 between elongated adhesive masses 48. The adhesive masses are about 50 to 75 microns high and, in the aggregate, cover between about 10% and 25% of bottom surface 25. Adhesive 44 is adapted to bond with the materials utilized in an assigned conductor chip as well as to bond with the bottom surface 25 of top layer 24. Most preferably, adhesive 44 is in a solid condition, and is adapted to remain solid and substantially non-tacky so long as the adhesive is below a preset activation temperature. However, adhesive 44 is adapted to convert to a momentarilly flowable condition upon heating to above the preset activation temperature and then to come to a solid bond. The activation temperature desirably is a temperature above room temperature, but below the temperature which would be damaging to the layers of the connection component or to the semiconductor structure which will be used with the connection component. Desirably, the activation temperature is between about 40 degrees C. and 90 degrees C. The thermosetting adhesives commonly referred to as "snap-cure" adhesives can be utilized. One suitable solvent-free snap-cure adhesive is sold under the trademark ABLEBOND 967-3, by the Ablestik Electronic Materials & Adhesives Company of Rancho Dominguez, Calif.

The uncured adhesive may be deposited on the bottom surface 25 by dispersing or dissolving the adhesive ingredients in a volatile liquid vehicle. The resulting mixture is then deposited on the bottom surface in the desired pattern by essentially any method of pattern wise liquid deposition as, for example, by stenciling, by silk screening or by, gravure printing, or by processes which employ photosensitive masking agents and patternwise illumination to form a stencil or mask for adhesive application. After the mixture has been deposited, the liquid vehicle is removed by evaporation, leaving a thin layer of uncured adhesive in the desired pattern. All of the steps of applying the bottom layer 24 and applying the adhesive pattern typically are performed while the top layers 22 remain connected to tape 28 by the lead connection sections 38, or before formation of gaps 32, when the top layers are integral with tape 28. The finished connection components resulting from this process are connected to one another by tape 2, and can be handled and stored in tape form.

To protect the adhesive during shipping and handling, the bottom surfaces of the connection component, and hence the surfaces of adhesive 44 may be covered by a readily peelable layer commonly referred to as a "release paper". (Not shown)

Figure 4:
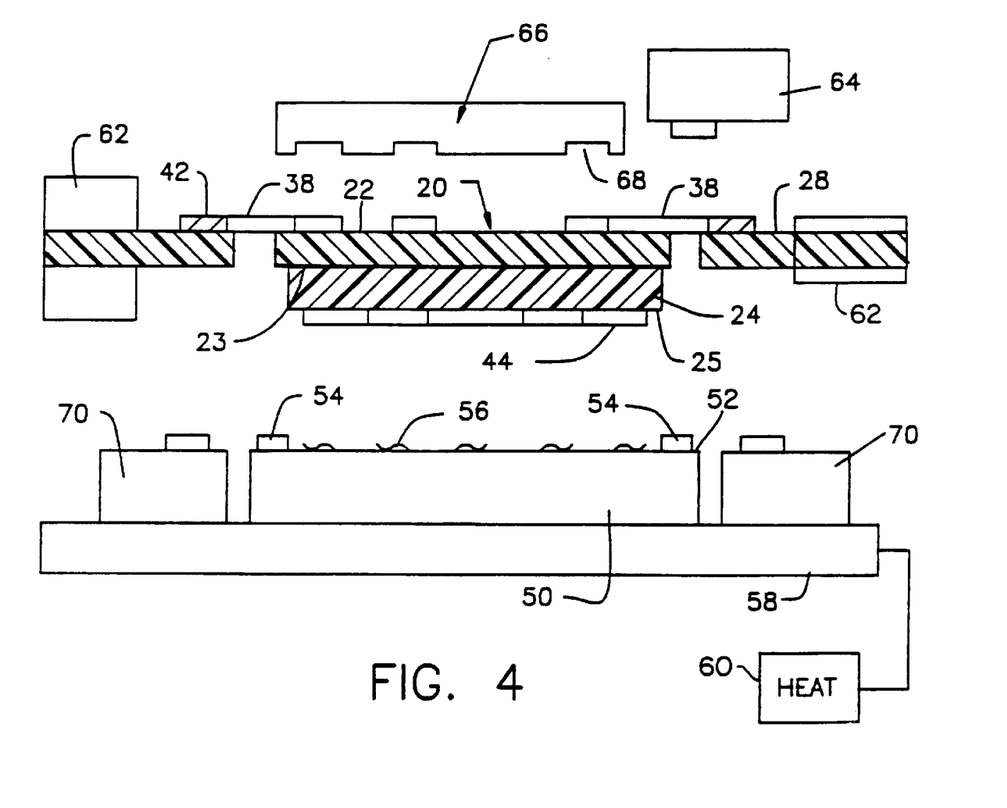
FIG. 4 is a diagrammatic sectional view depicting the tape of FIGS. 1–3 together with a semiconductor chip and processing equipment.

In a method according to a further aspect of the invention, the prefabricated connection components discussed above, are bonded to chips to form subassemblies. As illustrated in FIG. 4, a typical chip 50 has a top surface 52 with numerous electrical contacts or contact pads 54 on such top surface. The contacts are arranged in elongated rows, corresponding to the rows of conductor connection sections 38 on each connection component. Apart from the contacts 54, chip 52 has other, minor deviations 56 from a perfectly flat surface. Such deviations typically are referred to as "topography" and result from the processes used to fabricate the chip and from the selective deposition or removal of the various materials in the layers constituting the chip. Typically, such deviations from perfect flatness are in the range of less than one-thousandth of an inch (0.025 mm), and typically a few ten-thousandths of an inch. Chip 50 is heated to a temperature above the activation temperature of adhesive 44 while the chip is out of contact with the support structure and adhesive. As illustrated in FIG. 4, the chip may be disposed on a hot plate 58 which is heated by a heat source schematically indicated at 60, so that heat transferred from plate 58 to chip 50 heats the entire chip. Alternatively, the chip 50 may be held in an oven prior to positioning on plate 58, or else heated by convection or by radiant energy applied to the top surface after placement on the support.

While the chip is at its elevated temperature, the connection component is aligned with the chip so that the support structure 20 overlies the chip, with the bottom surface 25 of the support structure bottom layer facing downwardly towards the chip top surface 52. During this process, the connection component may be handled and supported through tape 28, as by a support 62, schematically indicated in FIG. 4, which engages the tape by means of sprocket holes 30 or other registration features (not shown) on the tape. A conventional, automated pattern recognition system 64 and associated conventional movement and positioning devices are used to register support 62, tape 28, and hence the connection component with the chip. Thus, the connection component is shifted in horizontal directions, parallel to chip top surface 52, until the connection sections 38 of the connection component leads are disposed vertically above the contacts 54 of the chip, in alignment therewith. This may be accomplished by moving the support 62, tape 28 and connection component support structure 20, or by moving the hot plate 58, or both under the control of pattern recognition device 64. During these stages of the process, the connection component, and hence the adhesive 44 on the bottom surface of the connection component, are maintained out of contact with the chip. The adhesive remains in its substantially solid, but non-tacky state.

After the connection component and chip have been aligned in this manner, the connection component and chip are advanced vertically towards one another, as by vertical movement of the support 62, of hot plate 58 or both. During this process, the alignment of the connection component with the chip is preserved so that connection sections 38 of the leads remain in alignment with contacts 54 of the chip. As the bottom surface 25 of the connection component support structure approaches the top surface 52 of the chip, adhesive 44 encounters the chip top surface, is heated to a flowable condition and forms a coherent layer extending outwardly to the edges of bottom surface 25 and substantially completing filling any space between bottom surface 25 and top surface 52. Thus, the adhesive substantially fills the spaces formed by irregularities or topography 56 on the chip. The adhesive is in a flowable condition only momentarily, and only a small amount of flowable adhesive is present. Further, flow of the adhesive is constrained by surface tension at the edge of the support structure. The adhesive therefore does not flow outwardly beyond the outermost edge of support structure 20, and does not cover the contacts 54 on the chip top surface.

Although the present invention is not limited by any theory of operation, it is believed that the initially non-tacky nature of the adhesive facilitates escape of air from small spaces and crevices during the bonding process. The pattern of the adhesive on the bottom surface of the connection component is believed to further facilitate the release of air from between the connection component bottom surface and the chip top surface. Here again, the present invention is not limited by theory of operation. However, it is believed that the depressions 47 between adhesive masses 48 provide escape channels or passageways for air. It is believed that these channels, being narrower adjacent the center and wider adjacent the periphery of the component, tend to close progressively from their inner ends, adjacent central mass 46 towards their outer ends. To facilitate complete engagement of the adhesive with the chip top surface, pressure may be applied to the top surface of the support structure 20, when the chip and the connection component are brought into engagement with one another as by a weight 66 disposed on top of the support structure. Weight 66 has holes or depressions 68 in its bottom surface in a pattern adapted to match the pattern of terminals 34 and the leads so that the weight will rest on the top surface of the top layer 22, rather then on the terminals.

The chip may be surrounded by a support frame 70 adapted to engage the portions of tape 28 surrounding the support structure of the connection component so as to maintain the same substantially coplanar with top layer 22. When the connection component is united with the chip 50, the chip desirably is at a temperature slightly above the activation temperature of the adhesive, and typically between 100–160° C. The chip and connection component may be held at this B-staging temperature for a substantial curing period, typically between a few minutes and an hour. Following this holding time, the chip and connection component assembly is subjected to a lead-bonding operation. In the lead-bonding operation, support 58 and chip 50 are brought to a final setting temperature, typically between 160° C. and 200° C. The lead connection sections 38 are bonded to contacts 54 by engaging each connection section with a bonding tool and forcing it downwardly so as to break the frangible section 40 (FIG. 2) holding the end of the lead to the bus structure 42 and so as to force the lead into engagement with the contact 54, in a compression, thermocompression, ultrasonic or similar bonding method. This process progressively detaches the connection component 20 from the surrounding tape 28, leaving the connection component attached to the chip by the bonded leads and by adhesive 44. The tape can be removed, leaving the individual connection component on the chip. The process of bonding the leads to the contacts may be substantially as described in co-pending, commonly assigned International Application PCT US 93/06930; and in co-pending commonly assigned U.S. patent application Ser. No. 07/919,772, the disclosures of which are incorporated by reference herein.

After the bonding process, tape 28 is removed, the assembly including the connection component and chip is cooled, typically to room temperature. In this condition, the adhesive 44 retains the connection component support structure 20 on the top surface of the chip, and provides a substantially void-free interface between these two components. This assembly can be electrically tested, as by engaging the electrical terminals 32 of the connection component with a test probe. As described in the aforementioned co-pending applications, the compliant layer 24 greatly facilitates testing of the assembly, inasmuch as a multiple-terminal test probe can engage all or many of terminals 34 simultaneously and place the chip into essentially full operation for test purposes. The compliant layer allows deformation of the top layer 22 and displacement of terminals 34 by small amounts in the vertical direction, thereby facilitating engagement with the test probe.

If the test indicates a fault in the subassembly, the connection component can be removed so that the chip can be salvaged from the subassembly. In the salvage operation, lead connection sections 38 may be debonded from the contacts 54 using conventional debonding techniques. Following such debonding, the connection component support 20 structure can be peeled away from the chip. The bond between adhesive 44 and the connection component bottom surface 25 is weaker than the bond 23 between compliant or bottom layer 24 and top layer 22. Thus, when the connection component support structure 20 is peeled away from the chip, the entire support structure remains together. Adhesive 44 remains on the chip top surface. The desired relationship of bond strengths need not be present at all temperatures. It should, however, be present at least one temperature within the range of permissible temperatures to which the chip can be exposed. For example, where the desired relatively high peel strength in bond 23 prevails only at relatively high temperatures, the assembly may be heated prior to peeling in the salvage operation.

After the salvage operation, the chip can be united with a new connection component using the same assembly process and tested once again. The layer of adhesive formed by the first connection component normally will remain as a residual layer on the top surface of the chip. The second connection component used process is assembled over the residual layer. The residual layer does not interfere with assembly of the second connection component; the adhesive included in the second connection component will form a substantially void-free bond with the residual layer. The residual layer left by the first connection component is so thin that it does not appreciably affect the position of the second component relative to the chip. The ability to rework defective subassemblies readily offers a significant advantage. Ordinarily, the cost of the chip far exceeds the cost of the connection component and subassembly process. Even though faults in the connection component and subassembly process are relatively rare, the overall cost of the process can be substantially reduced by salvaging the chips involved in those rare instances.

After the subassembly and testing process, the good chip subassemblies are connected to substrates. The substrates may include, for example, conventional, single-chip pin-bearing bases; circuit panels such as circuit boards; and multi-chip circuit panels. As described in the aforementioned copending applications, the terminals 34 may be connected to contact pads on the substrate. Typically, the substrate and the chips mounted thereon may be encapsulated or "potted" in a dielectric material such as an epoxy. An assembly including plurality of chips mounted on a common substrate, and typically encapsulated as a unit may serve as a module. Such a module may be used in substantially the same manner as a single chip mounted on a traditional substrate. The substantially void-free interface provided between the connection component bottom layer and chip top surface by the adhesive in this aspect of the invention greatly facilitates the assembly and module formation processes and as well as operation of the device during service. Because there is essentially no air trapped in the assembly, there is no tendency for any trapped air to expand either during the assembly process or during subsequent operation. Such expanding air or other gases would deleteriously affect a sealed component such as an encapsulated or potted module.

Figure 5:
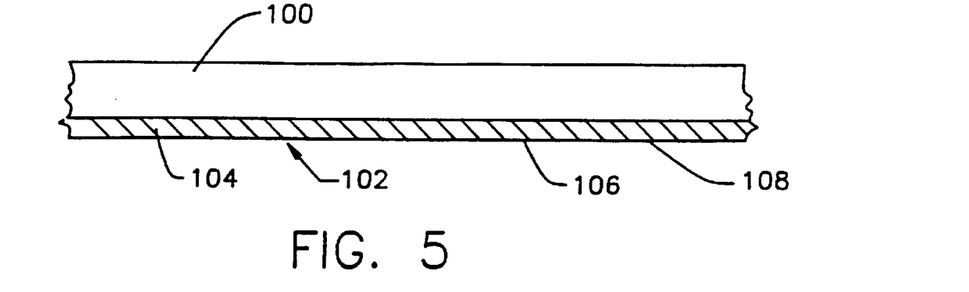
FIGS. 5–7 are diagrammatic sectional views depicting a component application process in accordance with one embodiment of the invention.
Figure 6:
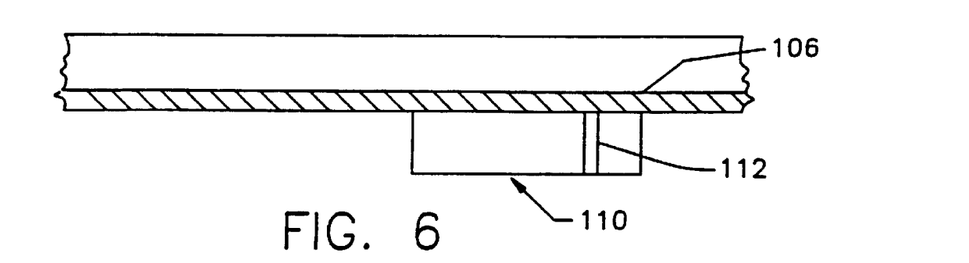
Figure 7:
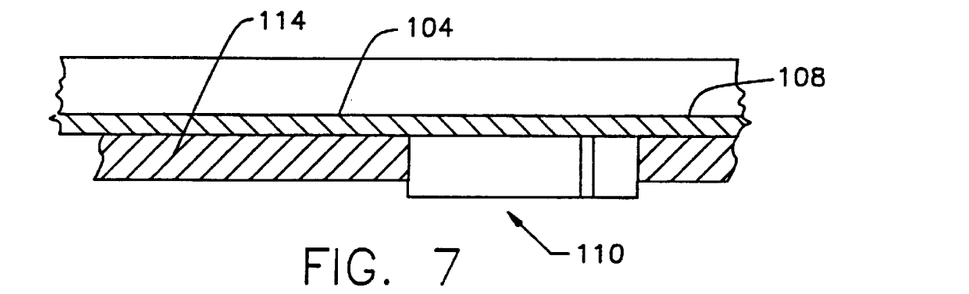
Figure 8:
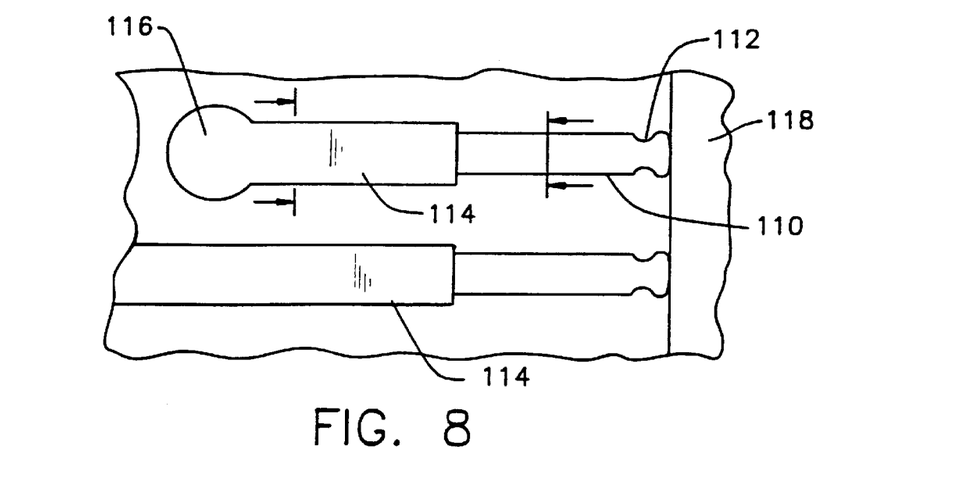
FIG. 8 is a diagrammatic, fragmentary bottom plan view depicting a component drawing a further step of the process of FIGS. 5–7.

A production process for making a connection component according to a further embodiment of the invention is illustrated in FIGS. 5–11. The process begins with a sheet material incorporating a layer 100 of a thin, flexible material as described above with reference to top layer 22, typically a polyimide. The dielectric material 100 is provided within a thin layer 102 of a base metal such as copper. Layer 102 typically is about 3,000–5,000 angstroms and preferably about 4,000 angstroms thick. This layer 102 extends over substantially the entire bottom surface of layer 100. Layer 102 has a lamination or trace zone 104 underlying the central portion of polyimide layer 100. That central portion of layer 100 will ultimately become the connection component top layer. Layer 102 also has a connection zone 106 extending around zone 104 in a rectangular frame-like pattern and a peripheral zone 108 extending around zone 106. As FIG. 5 is a fragmentary sectional view, only a portion of each such zone is visible. In the next stage of the process, a noble metal is applied as a series of bar-like elements 110, which only one is seen in FIG. 6, disposed side by side on connection section 106. The noble metal desirably is selected from the group consisting of gold, platinum, and combinations thereof.

The noble metal barlike elements 110 may include narrowed sections 112 which subsequently form the frangible sections of the leads. These elements typically are about 25 microns thick. Barlike elements 110 are applied using a conventional selective plating process, in which a photoresist material is deposited as a layer, light is applied selectively, using a photographic mask, and the photoresist is developed in the areas where the light impinges. In the conventional manner, the undeveloped photoresist is washed away, leaving openings in the developed photoresist in the areas to be plated. Following application of the noble metal, the photoresist used for this step is removed.

Figures 9, 10:
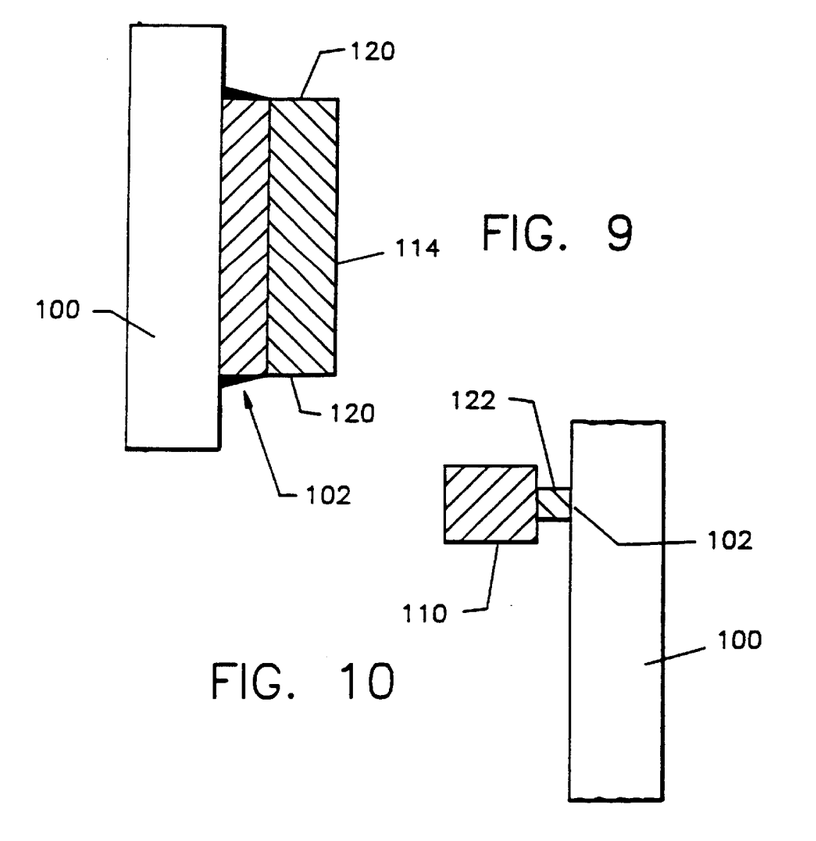
FIGS. 9 and 10 are diagrammatic, sectional views taken along lines 9—9 and 10—10 in FIG. 8.
Figure 11:
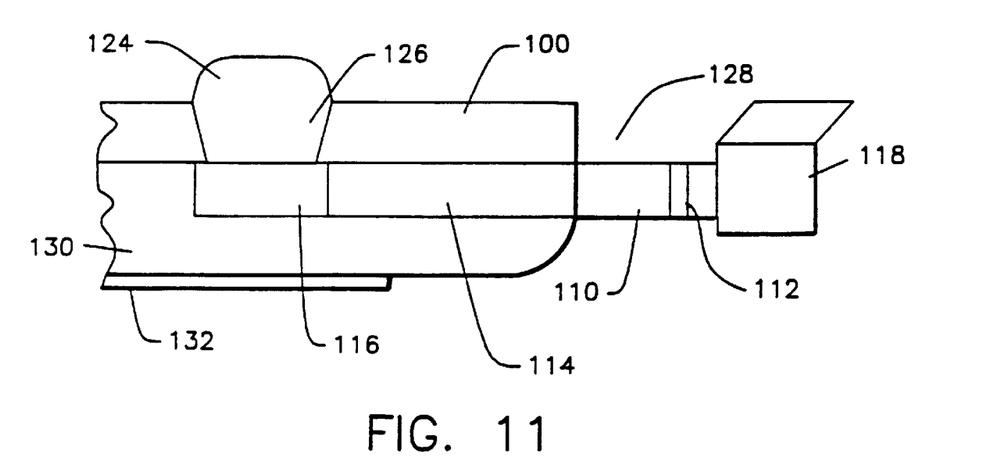
FIG. 11 is a further diagrammatic, sectional view depicting a component drawing a further step of the process of FIGS. 5–10.

In the next stage of the process, another base metal, preferably copper or a copper-based alloy, is applied selectively, using a similar photoresist and selective plating process to form elongated strips 114 extending across the lamination or trace zone 104 of layer 102, and also to form terminal pads 116 in the trace zone. Each strip 114 is connected to one of the noble metal elements 110. The base metal elements applied in this process further include a rectangular, framelike bus 118 overlying the peripheral zone 108 of flash layer 102. Strips 114, pads 116 and bus 118 are considerably thicker than flash layer 102. Typically, these features are about 25 to about 30 micrometers thick. Following formation of these features, and removal of the photoresist used to form them, the entire structure is subjected to an etching process using an etchant which attacks the base metal in layer 102. This etching process is continued for a time sufficient to remove those portions of layer 102 which remain uncovered by other features. The same etchant also attacks the base metal in strips 114, pads 116 and ring 118. However, because these features are substantially thicker than layer 102, they are not removed but remain in place. As seen in FIG. 9, each strip 114 and the underlying portion of flash layer 102 following the etching process form an integral strip-like lead or trace extending from the associated noble metal strip 110 to a terminal pad 116. Although strip 114 and the underlying portion of layer 102 are delineated separately in FIG. 9 for clarity of illustration, it should be appreciated that the base metal strip and the underlying base metal portions 102 form a unitary part, so that the portion adjacent layer 100 (formed from layer 102) is substantially indistinguishable from the remainder of the strip. The lateral walls 120 formed by the etching process forming the lateral boundaries of the strip are substantially straight or splayed outwardly away from one another adjacent the dielectric layer 100. Lateral walls 120 do not form notches or undercuts between strip 114 and layer 100. The same is true with respect to the periphery of terminal pads 116 and also with respect to bus 118. By contrast, as seen in FIG. 10, noble metal strips 110 may form significant undercuts 122. That is, because the noble metal elements are not themselves attacked by the etchant which attacks the base metal of layer 102, the etchant attacks only the underlying base metal layer, and leaves the noble metal at substantially its original width. This forms undercuts 122.

In the remaining stages of the process, holes 126 are formed in layer 100 in alignment with terminal pads 116, and terminal bumps 124 are fabricated by plating with copper, nickel and other suitable metals. During this stage of the processss, the features on the bottom surface of layer 100, such as ring 118, noble metal strips 110, base metal strips 114 and terminal pads 116 are covered by a temporary protective layer or resist. Dielectric layer 100 is etched to form an aperture or gap 128 extending around the central portion of layer 100 in alignment with the noble metal strips 110. This exposes the top surface of each noble metal strip, and hence exposes the small strip of base metal layer 102 which previously remained between the noble metal strip and the dielectric layer. The structure is then subjected to an etching process to remove these base metal portions, leaving noble metal strips 110 devoid of base metal.

Following these procedures, a compliant dielectric support structure layer 130 is applied on the bottom surface of the top dielectric layer 100 so that strips 114 as well as terminal pads 116 are sandwiched between compliant layer 130 and top dielectric layer 100. Compliant layer 130 is formed by applying a flowable material, preferably a curable liquid silicone elastomer material, on the bottom surface of top layer 100. The flowable material may incorporate fillers and reinforcing agents. Further uncured, cured or partially cured layers may be applied over the flowable material forming layer 130.

The flowable material applied in layer 130 flows into intimate contact with strips or traces 114 and with top layer 100. The absence of undercuts on the edges of traces 114 permits formation of a void-free structure at the strip edges. Likewise, the absence of undercuts at the edges of contact pads 116 aids in forming a void-free structure. Following curing of layer 130, an adhesive layer 132 may be applied as discussed above, and the component may be utilized in the manner discussed above.

Numerous variations and combinations of the features discussed above may be utilized without departing from the present invention as defined by the claims. In one such variant, the base metal traces 114 and noble metal strips 110 are formed on the top surface of dielectric top layer 100 and the compliant layer 130 is formed on the bottom surface. One or more electrically conductive ground plane or power plane elements may be provided on the top or bottom surface of dielectric top layer 100, or embedded in compliant layer 130 or top layer 100. These electrically conductive layers are electrically isolated from the other conductive elements of the structure.

Figure 12:
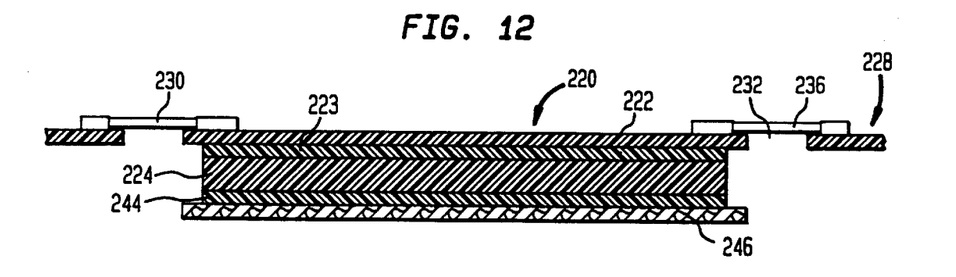
FIG. 12 is a diagrammatic sectional view depicting a connection component in accordance with a further embodiment of the invention.

A prefabricated connection component in accordance with a further embodiment of the invention includes a bottom layer 224 from an elastomeric material. Bottom layer 224 is formed as a large sheet or semi-continuous strip by casting a liquid film comprising the unreacted ingredients of a curable electronic grade silicone elastomer such as the aforementioned Sylguard 577 material with an inert inorganic filler, such as silicon dioxide. This liquid film is cured on a release film at a thickness of about 0.004–0.005 inches, i.e., about 0.10 to about 0.13 mm. The amount of filler is selected to provide the finally cured film with a coefficient of thermal expansion close to that of the semiconductor chip with which the component will be employed. After the bottom layer 224 has been cured, it is coated with a further, thin layer 244 of a curable silicone material, desirably the same unreacted electronic grade silicone used to form layer 224, but without the filler. Layer 244 may be deposited from a coating solution including a volatile diluent such as toluene. Layer 244 is substantially thinner than layer 224. Desirably, layer 244 is less than about 0.05 mm thick. Layer 244 is brought to a tacky, semicured "B-stage", as by heating to a temperature high enough to start the reaction between the components but not high enough to complete the curing process. A release paper 246 is applied on the surface of layer 244. A further, bond layer 223 formed from the same material in similar thickness is applied on the opposite side of layer 224 and similarly brought to a partially cured or B-stage and then covered with a further release paper (not shown). Release paper 246 and the release paper covering bond layer 223 have low-surface energy, slick surfaces, well-known in the laminating art. These coatings do not adhere to the tacky materials of layers 223 and 244.

After bottom layer 224 and the tacky layers 244 and 223 have been formed in this fashion, the laminate is cut from continuous or semi-continuous sheets to pieces of the appropriate size and joined with a top layer 222 similar to the top layer 22 of the structures discussed above. The top layer is bordered by gaps 232 and connected by frangible leads 236 to the surrounding portions of a tape 228, in substantially the same manner as discussed above. Top layer 222 and tape 228 are formed from a polyimide material. In uniting the bottom layer 224 and top layer 222, the release paper covering bond layer 223 is removed and the bond layer is pressed or rolled onto the facing surface of top layer 222. Bond layer 223 is not cured further at this stage of the process but instead is left in the B-stage condition along with lower adhesive layer 244. The preformed component is now ready for use.

In use, the release paper 246 is stripped from layer 244 and the component is engaged with a semiconductor chip in much the same way as the components discussed above. To avoid air entrapment during engagement of the support structure with the chip, this step may be carried out inside on evacuated chamber. While the support structure is held in engagement with the semiconductor chip, the support structure, including layers 244 and 223 is heated and held at an elevated temperature until the B-stage materials in these layers cure. This curing completes the bond between bottom layer 224 and top layer 222 and also completes the bond between the bottom layer and the chip (not shown).

Figure 13:
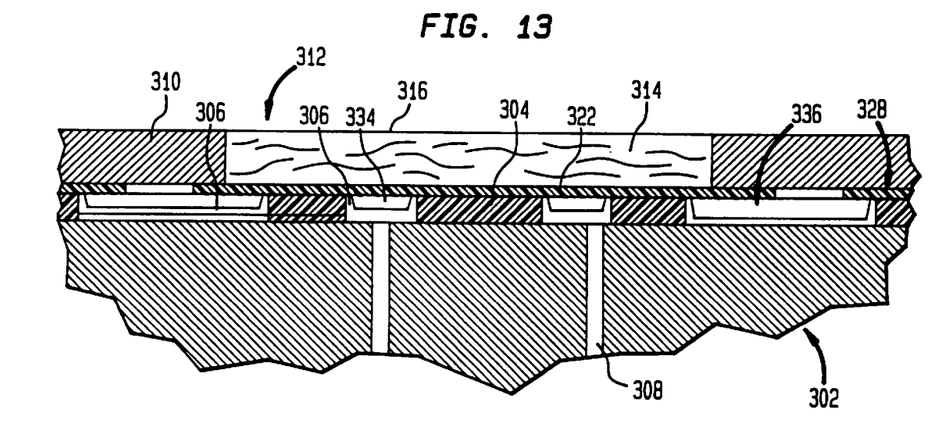
FIG. 13 is a further diagrammatic sectional view depicting a process for manufacturing a connection component in accordance with yet another embodiment of the invention.
Figure 14:
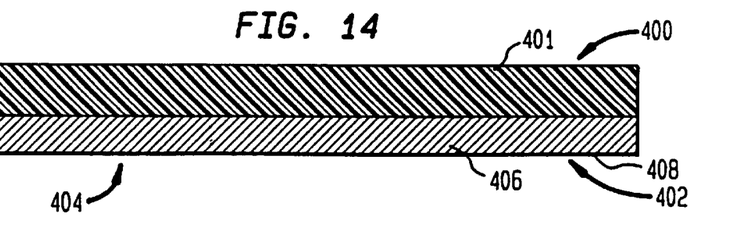
FIGS. 14 through 17 are diagrammatic sectional views depicting a production process in accordance with a further embodiment of the invention.
Figure 15:
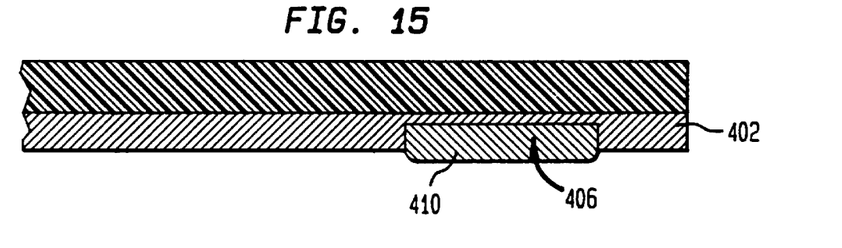
Figure 16:
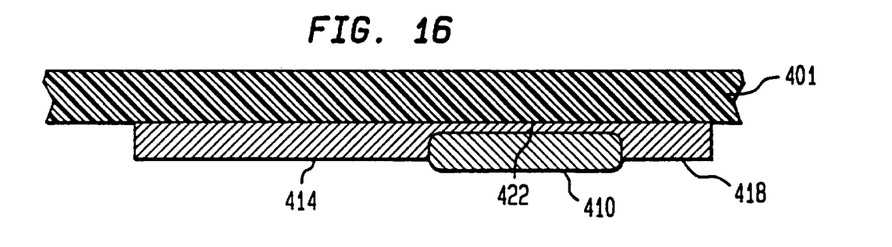
Figure 17:
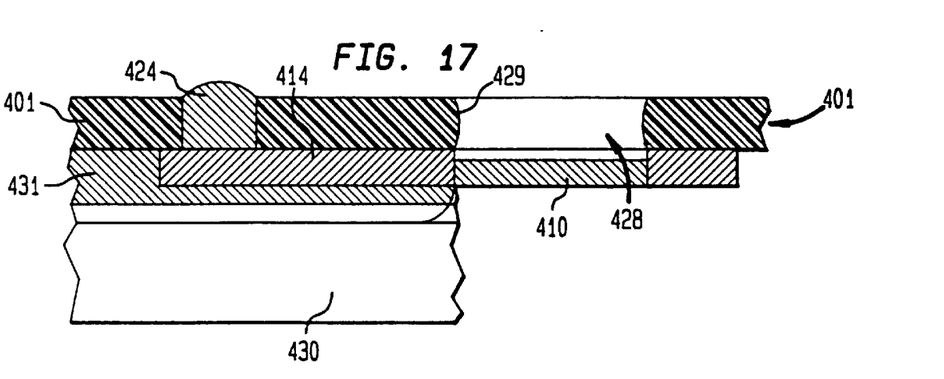

Yet another process for making a connection component is illustrated in FIG. 13. A tape 328 incorporating a connection component top layer 322 is placed upside down on a vacuum fixture 302. The vacuum fixture is covered with a spacer sheet 304 having holes 306 at positions corresponding to the raised features on the top side of the connection component top layer, such as the terminals 334 and leads 336. Thus, these raised structures nest in holes 306 of the spacer sheet. The top layer 322 is supported by engagement between the layer itself and buffer sheet 304. Vacuum is applied through holes or pores 308 in fixture 302, so that atmospheric pressure forces top layer 322 against buffer sheet 304 and forces the buffer sheet against fixture 302. This firmly clamps the top layer in place. Although only one connection component is seen in FIG. 13, the process typically is performed while numerous connection components are united with one another in a common tape 328 or sheet. Thus, vacuum fixture 302 and buffer sheet 304 are large enough to accommodate numerous connection components side by side. For example, where the connection components are formed in plating and etching processes in a sheet or tape including multiple connection components, that same sheet may be employed in the step illustrated in FIG. 13.

While the top layer is held in place in this manner, a stencil 310 in the form of a metal plate or sheet is placed on the top layer 322. Stencil 310 has thickness equal to the desired thickness of the bottom layer in the connection component support structure, typically about 0.005 to 0.007 inches (about 0.13 to about 0.18 mm). The stencil desirably is formed from a rigid, non-contaminating metal, such as, molybdenum. Stencil 310 has openings 312, of which only one is visible in FIG. 13 at locations corresponding to the locations of the individual connection components.

An elastomer-forming paste then applied through openings 312 to form an uncured layer 314 on each top layer 322. The paste forming layer 324 desirably includes an uncured electronic grade silicone elastomer as discussed above, together with an inert filler such as silicon dioxide. However, the amount of filler desirably is enough to impart a paste-like, relatively thick consistency to the uncured material. The surface 316 of layer 314 may be initially leveled by a squeegee or doctor blade passing over the surface of stencil 310. While the material of layer 314 is held in the stencil, the assemblage is brought to an elevated temperature to initiate cure of the elastomer. The material may be completely cured or "C-staged" to form a finished elastomeric layer, and a further adhesive layer may be applied to the exposed surface of this cured layer. In one process, the adhesive layer is applied by applying an uncured silicone elastomer with a diluent similar to the materials used to form layers 223 and 224 discussed above with reference to FIG. 12, and this material is partially cured or "B-staged". Alternatively, a snap-cure adhesive as discussed above with reference to FIGS. 1–4 is applied to the exposed surface of the cured elastomer layer. In either case, the adhesive layer is activated to bond the structure to the chip in the same manner as discussed above. Alternatively, the entire layer 314 may be only partially cured or B-staged, so that the connection component includes only a partially cured layer of elastomer material. The layer is left in that partially cured stage until assembly with the chip, whereupon the layer is further cured to solidify the elastomeric material and also to bond the structure to the chip. In this case, the exposed surface of the partially cured elastomeric material itself serves as the adhesive layer on the bottom surface of the support structure. Stated another way, the adhesive layer is integral with the elastomeric layer of the support structure.

An additional production process for making connection components is partially illustrated in FIGS. 14–17. This process begins with a laminate 400 incorporating a dielectric layer 401 and a base metal, typically copper, layer 402 covering the entire lower surface of dielectric layer 401. Dielectric layer 401 may be a thin, flexible polyimide sheet as discussed above, typically about 0.001 inches (0.025 mm) thick. The base metal layer 402 is substantially thicker than the layer 102 used in the process discussed above with reference to FIGS. 5–11. Thus, layer 402 has a thickness equal to the thickness of the desired base-metal features on the bottom surface of layer 401, i.e., a thickness equal to the desired thickness for the traces to be formed in the connection component. Thus, layer 402 desirably is about 0.0005 to about 0.00075 inches (about 0.013 to about 0.019 mm) thick. Layer 402 has a trace zone 404 underlying a central portion of polyimid layer 401; a connection zone 406 extending in a rectangular framelike pattern around trace or central zone 404 and a peripheral zone 408 surrounding zone 406. In the sectional view of FIG. 14, only those part of connection zone 406 and peripheral zone 408 to the right of trace zone 404 are seen. There are other, similar portions of zones 406 and 408 on the other sides of trace zone 404.

In the first stage of the process, a resist is applied and cured using a photo lithographic technique so as to cover the entire bottom surface of layer 402 except within a series of striplike regions extending side by side across connection zone 406. The laminate is then exposed to an etchant which etches the striplike regions to form grooves extending across the connection zone. The resist used for this process is then removed and a new layer of resist is then applied, leaving the grooves exposed. A noble metal such as gold, platinum or combinations thereof is then plated in the grooves to form barlike elements 410 extending side by side across the connection zone. Although each barlike element 410 is depicted as a simple elongated bar, the barlike elements 410 may incorporate narrow, frangible sections formed by appropriate patterning of the photoresist. The resist used for this process is then removed. A further photoresist is applied so as to cover only selected strips 414 of the trace region 404 and only a selected bus portion 418 of the peripheral portion 408 as well as to cover the noble metal barlike elements 410. The laminate is then exposed once again to an etchant which attacks the copper base metal, leaving only strips 414, bus 418 and barlike elements 410, together with some residual base metal disposed between the noble metal barlike element 410 and the dielectric layer 401. Strips 414 extend into the central region of the connection component, and may terminate in enlarged pads or connection areas. Bus 418 may have a rectangular framelike configuration similar to bus 42 discussed above with reference to FIG. 2.

An electroplating resist (not shown) is applied over the metallic components. Then holes are formed through the dielectric top layer 401 by ablation. Terminal bumps 424 are formed in these holes in contact with strips 414 so that the terminal bumps 424 are exposed on the top surface. The resist is then stripped.

Following this treatment, dielectric layer 401 is further ablated to form an aperture or gap 428 extending around the central portion of layer 401, in alignment with the region previously occupied by connection region 406 (FIG. 14) and now occupied by noble metal strips 410. This leaves strips or traces 414 extending inwardly from the edge 429 of the top layer central portion, and leaves noble metal elements 410 protruding beyond such edge. The laminate is then subjected to a further base-metal etching process. This removes the small portions 422 (FIG. 16) of the copper base metal left between the noble metal elements 410 and the dielectric layer. A compliant layer 430 is applied on the bottom of layer 401 so that compliant layer 430 covers the bottom surface of layer 401 and also covers the base metal strips 414. In this case, compliant layer 430 is applied as a coherent, precured layer, with a flowable material 431 such as a flowable, B-staged partially cured elastomer at the top surface of layer 430. Thus, the flowable material in layer 431 flows into intimate contact with the dielectric layer 401 and also with the strips 414. Alternatively, the compliant layer may be formed entirely from a flowable material which is cured in place. In either case, the base metal strips 414 do not tend to trap air. That is, because the base metal strips do not have an overlying noble metal covering, they do not tend to form undercuts.

As these and other variations and combinations of the features discussed above can be utilized without departing from the present invention as defined by the claims, the foregoing description of the preferred embodiments should be taken by way of illustration rather than by way of limitation of the claimed invention.

What is claimed is:

1. A method of fabricating a connection component for a semiconductor chip comprising the steps of:

(a) providing a dielectric top layer with a thin, flat layer of a base metal so that a lamination zone of the base metal layer underlies a bottom surface of such top layer and so that said base metal layer also has a connection zone portion;

(b) providing a noble metal on said base metal only in said connection zone portion;

(c) etching said base metal to form elongated striplike leads of said base metal extending from said lamination zone to said connection zone and, completely removing said base metal during said etching step in said connection zone, whereby each said lead includes a lamination zone portion consisting solely of flat strip of said base metal and an adjacent connection zone portion consisting solely of said noble metal; and (d) after said etching step, applying a second support structure layer on said bottom surface of said top layer so that said flat strips of said base metal are sandwiched between said second support structure layer and said top layer and substantially without voids adjacent said strips.

2. A method as claimed in claim 1 wherein said step of applying said second support structure layer includes the step of applying a flowable material to said bottom surface and said strips and curing said flowable material.

3. A method as claimed in claim 2 further comprising the steps of applying an adhesive on said second support structure layer and bringing said adhesive to a ready state wherein said adhesive is solid and substantially non-tacky.

4. A method as claimed in claim 3 wherein said step of applying an adhesive includes the step of applying said adhesive in a pattern incorporating masses of adhesive and depressions between said masses.

* * * * *